(12) United States Patent
Chang et al.

(10) Patent No.: US 7,045,799 B1
(45) Date of Patent: May 16, 2006

(54) WEAKENING FOCUSING EFFECT OF ACCELERATION-DECELERATION COLUMN OF ION IMPLANTER

(75) Inventors: Shengwu Chang, South Hamilton, MA (US); Joseph C. Olson, Beverly, MA (US); Donald Anderson, Rowley, MA (US); Daniel McGillicuddy, Meford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/993,346

(22) Filed: Nov. 19, 2004

(51) Int. Cl.
*H01J 37/317* (2006.01)
(52) U.S. Cl. .............. 250/492.2; 250/492.21; 250/492.3; 250/281
(58) Field of Classification Search ............ 250/492.21
See application file for complete search history.

(56) References Cited

U.S. PATENT DOCUMENTS 4,766,320 A * 8/1988 Naitoh et al. ............ 250/492.2

* cited by examiner

*Primary Examiner*—John R. Lee
*Assistant Examiner*—James J. Leybourne

(57) ABSTRACT

A method and apparatus for weakening a strong focus effect of an acceleration-deceleration column of an ion implanter during a deceleration mode are disclosed. The apparatus includes a tube lens surrounding the ion beam adjacent to a deceleration lens of the acceleration-deceleration column. The tube lens causes a defocusing of the ion beam at the entrance of the tube lens, which reduces the ion dispersion problem generated by the column. The invention also includes an accel-decel column and ion implanter incorporating the tube lens. An additional deceleration-suppression electrode may also be added subsequent to the tube lens for confining electrons within the tube lens.

32 Claims, 4 Drawing Sheets

WEAKENING FOCUSING EFFECT OF ACCELERATION-DECELERATION COLUMN OF ION IMPLANTER

BACKGROUND OF THE INVENTION

1. Technical Field

The present invention relates generally to ion implanters, and more particularly, to a method and apparatus for weakening a strong focus effect of an acceleration-deceleration column of an ion implanter.

2. Related Art

Improving productivity of ion implanters that use a low energy beam is a continuing issue in the ion implanter industry. One area of focus is improving beam transport efficiency. In any ion beam, the positively charged ions tend to repel one another, which causes loss of ions and poor beam transport. Referring to FIG. 1, a conventional ion implanter 100 is illustrated. Ion implanter 100 generates and transmits an ion beam 104 to a target 106 in an implant chamber 108. Ion implanter 100 includes a gas flow 140; an ion source 142 including a source magnet 144 and a source bias voltage controller 146; a suppression electrode 148, an extraction electrode 150 and one or more manipulator motors (not shown) for electrodes 148, 150; a filter magnet 151; a filter resolving aperture 152; an acceleration-deceleration column 200; an analyzer magnet 156; a mass slit 160; a pre-scan suppression electrode 162; horizontal scan plates 164; a post-scan suppression electrode 166; a nitrogen ($N_2$) bleed 168; a corrector magnet 170; a limiting aperture 172; and a profiler system 174. Each of the above-described components is monitored by and responsive to system controller 120. Typically, target 106 includes one or more semiconductor wafers mounted to a platen 114.

Referring to FIG. 2, ion beam acceleration-deceleration column 200 accelerates or decelerates ion beam 104 prior to mass analysis by analyzer magnet 156 (FIG. 1). Initially, ion beam 104 is formed at filter resolving aperture 202 from a ion source 142 trough extraction electrode 150 and filter magnet 151, which removes most of unselected ions from beam 104 (FIG. 1). Ion beam 104 is initially formed with high energy because it is relatively difficult to obtain a beam with high beam current at low energies from ion source 142 directly. Accordingly, a conventional ion implanter 100 is designed to run at a reasonably high source extraction voltage, for example, greater than 40 kV to give generated ions initial upstream velocity. Acceleration-deceleration column 200 applies different potential gradients that generate electric fields that decelerate (as shown in FIG. 2) or accelerate ion beam 104 depending on its mode as the ions pass through to give the ions their final velocity. Acceleration-deceleration column 200 includes terminal electrodes 204 to receive ion beam 104 into accel-decel column 200. Next, a focus electrode 206 provides an adjustable focusing effect to ion beam 104, which also produces an electron trap to prevent the neutralizing electrons from being removed from the region of the beam-line located before the deceleration region during the deceleration mode. Next, a ground electrode 208 receive ion beam 104 with its final energy. In the acceleration mode (not shown), an electric field generated between terminal electrodes 204 and ground electrode 208 forms an acceleration lens by applying a positive voltage on terminal electrodes 204 to energize and accelerate the positively charged particles of ion beam 104. Acceleration-suppression electrode 210 is biased with a negative voltage that suppresses secondary electrons during the acceleration mode. In the deceleration mode, shown in FIG. 2, an electric field generated between terminal electrodes 204 and ground electrode 208 form a deceleration lens by applying a negative voltage on terminal electrodes 204 to de-energize and decelerate the positively charged particles in ion beam 104.

As shown in FIG. 2, as acceleration-deceleration column 200 decelerates ion beam 104 and lowers its energy, it tends to drastically focus ion beam 104. In particular, as the ions leave the deceleration lens, they have a large convergent angle, i.e., they are tending to move inwardly with a large vertical velocity component. The large convergent angle causes ion beam 104 to have a large divergent angle afterwards, i.e., the ion will move outwardly with the same amount of vertical velocity component and thus increases the dispersion problem and reduce the transport efficiency of the low energy beam, i.e., ions are loss to dispersion as the beam exits accel-decel column 200. (Ion beam 104 exits via a coupling device 212, which provides a sliding vacuum seal to the analyzer magnet). The larger the energy change in ion beam 104, the more drastic the focusing and the more drastic the dispersion problem. It should be recognized that while FIG. 2 shows a two-dimensional view of ion beam 104 envelope, the focusing action is dependent on radial position within ion beam 104. That is, the closer to the inner edge of electrode 210, the stronger the focusing effect.

In view of the foregoing, there is a need in the art for improved beam transport efficiency relative to an acceleration-deceleration column of an ion implanter.

SUMMARY OF THE INVENTION

The invention includes a method and apparatus for weakening a strong focus effect of an acceleration-deceleration column of an ion implanter during a deceleration mode. The apparatus includes a tube lens surrounding the ion beam adjacent to a deceleration lens of the acceleration-deceleration column. The tube lens causes a defocusing of the ion beam at the entrance of the tube lens, which reduces the ion dispersion problem generated by the column. The invention also includes an accel-decel column and ion implanter incorporating the tube lens. An additional deceleration-suppression electrode may also be added subsequent to the tube lens for confining electrons within the tube lens.

A first aspect of the invention is directed to an apparatus for weakening a focusing effect of an acceleration-deceleration column for an ion beam in an ion implanter, the apparatus comprising: a tube lens surrounding the ion beam adjacent to a deceleration lens of the acceleration-deceleration column.

A second aspect of the invention is directed to an acceleration-deceleration column for an ion beam in an ion implanter, the acceleration-deceleration column comprising: a deceleration lens for decelerating the ion beam including terminal electrodes and a focus electrode adjacent the terminal electrodes and a ground electrode adjacent the focus electrode; and a tube lens surrounding the ion beam and adjacent to the deceleration lens.

A third aspect of the invention is directed to an ion implanter comprising: an ion source for generating an ion beam; an acceleration-deceleration column for accelerating or decelerating the ion beam, the acceleration-deceleration column including a deceleration lens; a tube lens surrounding the ion beam and adjacent to the deceleration lens; an analyzer magnet downstream from the tube lens; and an implant chamber for holding a target to be implanted by the ion beam.

A fourth aspect of the invention includes a method of weakening a focusing effect of an acceleration-deceleration column for an ion beam in an ion implanter, the method comprising the steps of: decelerating the ion beam using the acceleration-deceleration column; and transmitting the ion beam through a tube lens having a negative potential during the decelerating step to defocus the ion beam.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 3:
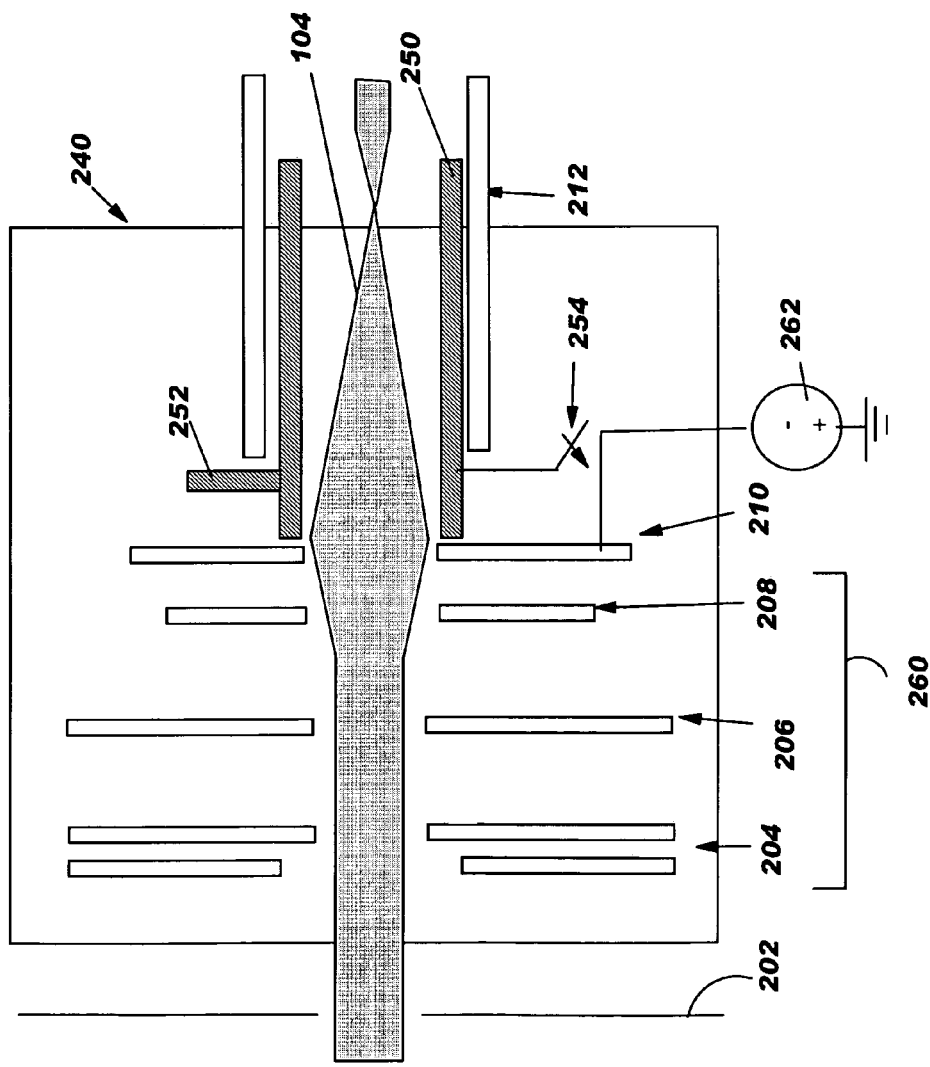
FIG. 3 shows a cross-sectional view of the acceleration-deceleration column including a tube lens according to one embodiment of the invention in a deceleration mode.

With reference to FIG. 3, details of an acceleration-deceleration column 240 according to the invention will now be described. Hereinafter, acceleration-deceleration column 240 will be referred to as "accel-decel column" for brevity. Accel-decel column 240 includes the same structure as a conventional acceleration-deceleration column, except for the addition of an electrostatic tube lens 250 according to the invention. Although not shown of clarity except where necessary, each electrode is coupled to a controllable power source. As illustrated, tube lens 250 is an electrostatic, substantially cylindrical tube surrounding ion beam 104 adjacent to (not necessarily immediately) a deceleration lens 260 formed by terminal electrodes 204, focus electrode 206 and ground electrode 208. Tube lens 250 includes a radially extending mount 252 for mounting it in place in accel-decel column 240. As illustrated in FIG. 3, tube lens 250 does not contact an acceleration-suppression electrode 210 of accel-decel column 200.

Figure 2:
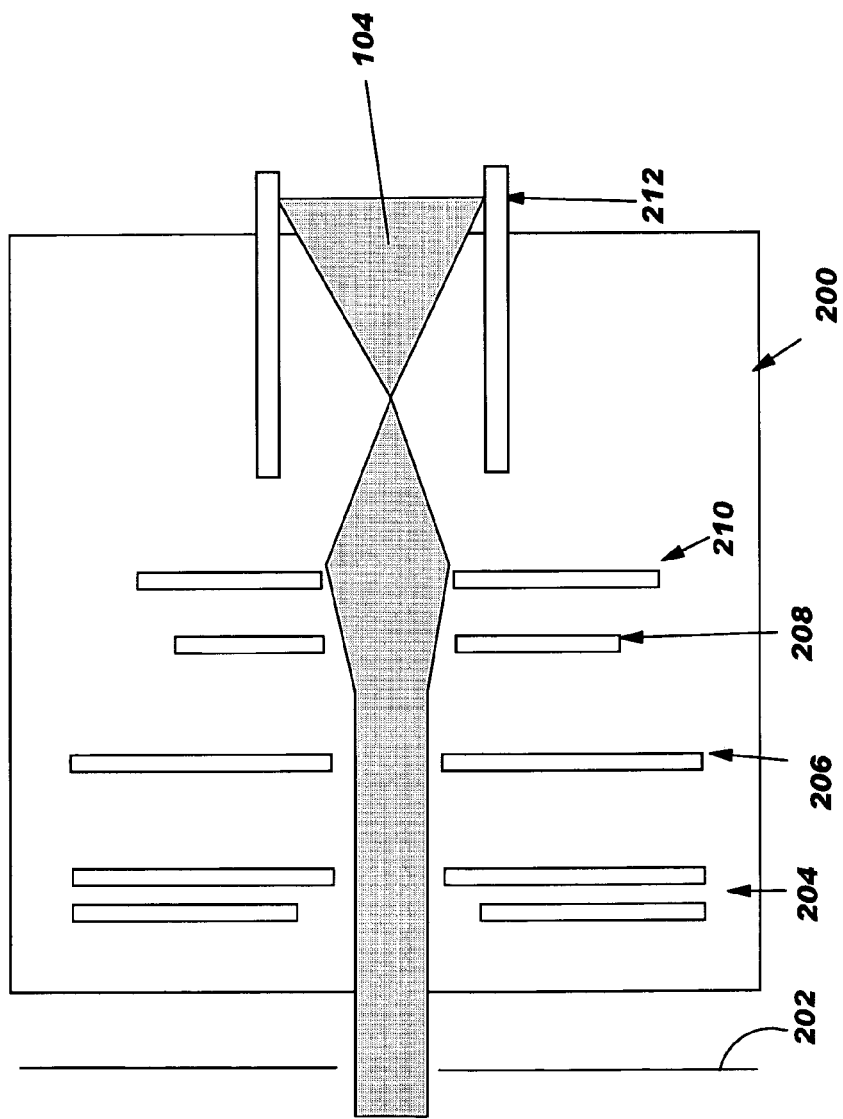
FIG. 2 shows a cross-sectional view of an acceleration-deceleration column of the ion implanter of FIG. 1 in a deceleration mode.

As described above, accel-decel column 200 has an acceleration mode in which ion beam 104 is energized and accelerated and a deceleration mode (shown) in which ion beam 104 is de-energized and decelerated. In the acceleration mode (not shown), terminal electrodes 204 are charged with a positive voltage such that terminal electrodes 204, focus electrode 206 and ground electrode 208 form an acceleration lens that provide a positive potential gradient through which ion beam 104 passes, which generates an electric field to energize and accelerate the positively charged particles of ion beam 104. Acceleration-suppression electrode 210 is biased with a negative voltage that suppresses secondary electrons during the acceleration mode. In contrast, in the deceleration mode, which is shown in FIG. 2, terminal electrodes 204 are charged with a negative voltage such that terminal electrodes 204, focus electrode 206 and ground electrode 208 form a deceleration lens 260 that provides a negative potential gradient through which ion beam 104 passes, which generates an electric field to de-energize and decelerate the positively charged particles in ion beam 104. The deceleration may be, for example, from an energy greater than 40 kV to less than 40 kV, which represents a low energy beam. As described above, the ions leaving deceleration lens 260 have a large convergent angle, i.e., they are tending to focus or move inwardly. The large convergent angle causes ions to have a large divergent angle afterwards and thus increases the dispersion problem and reduces the transport efficiency of the low energy beam.

Tube lens 250 acts as a defocusing lens that gradually weakens the focusing effect of deceleration lens 260 in the deceleration mode. In the deceleration mode of accel-decel column 200, shown in FIG. 3, tube lens 250 is charged with a negative voltage so as to form a defocusing lens. In the deceleration mode, acceleration-suppression electrode 210 is also charged with a negative voltage via a controller 262. Accordingly, in one embodiment, tube lens 250 is electrically coupled to acceleration-suppression electrode 210 via a switch 254 in the deceleration mode, but this is not necessary. That is, tube lens 250 may be provided with its own power source for more control of potential matching with acceleration-suppression electrode 210.

As illustrated in FIG. 3, the application of the negative potential to tube lens 250 creates an electric field between ground electrode 210 and an entrance of tube lens 250. The electric field has an outwardly vertical component, which causes a reduction in the convergent angle of the ions, and hence, a defocusing of ion beam 104 at the entrance of tube lens 250 as ion beam 104 enters tube lens 250. Tube lens 250 is configured to be sufficiently long such that the optical defocusing effect occurs within its length, i.e., ion beam 104 can defocus and change shape before it exits tube lens 250. In addition, tube lens 250 is positioned where the focusing action of deceleration lens 260 is the strongest, i.e., just after acceleration-suppression electrode 210. The voltage on tube lens 250 is controlled by controller 262 (or separate controller if tube lens 250 is not electrically coupled to acceleration-suppression electrode 210) so as to regulate the ion beam 104 dimension and angle as it exits tube lens 250.

When accel-decel column 200 is in the acceleration mode, tube lens 250 is grounded such that it has no affect on ion beam 104. In one embodiment, during the acceleration mode, tube lens 250 is electrically coupled to a coupling device 212, which acts as a ground for tube lens 250, but this is not necessary.

Figure 1:
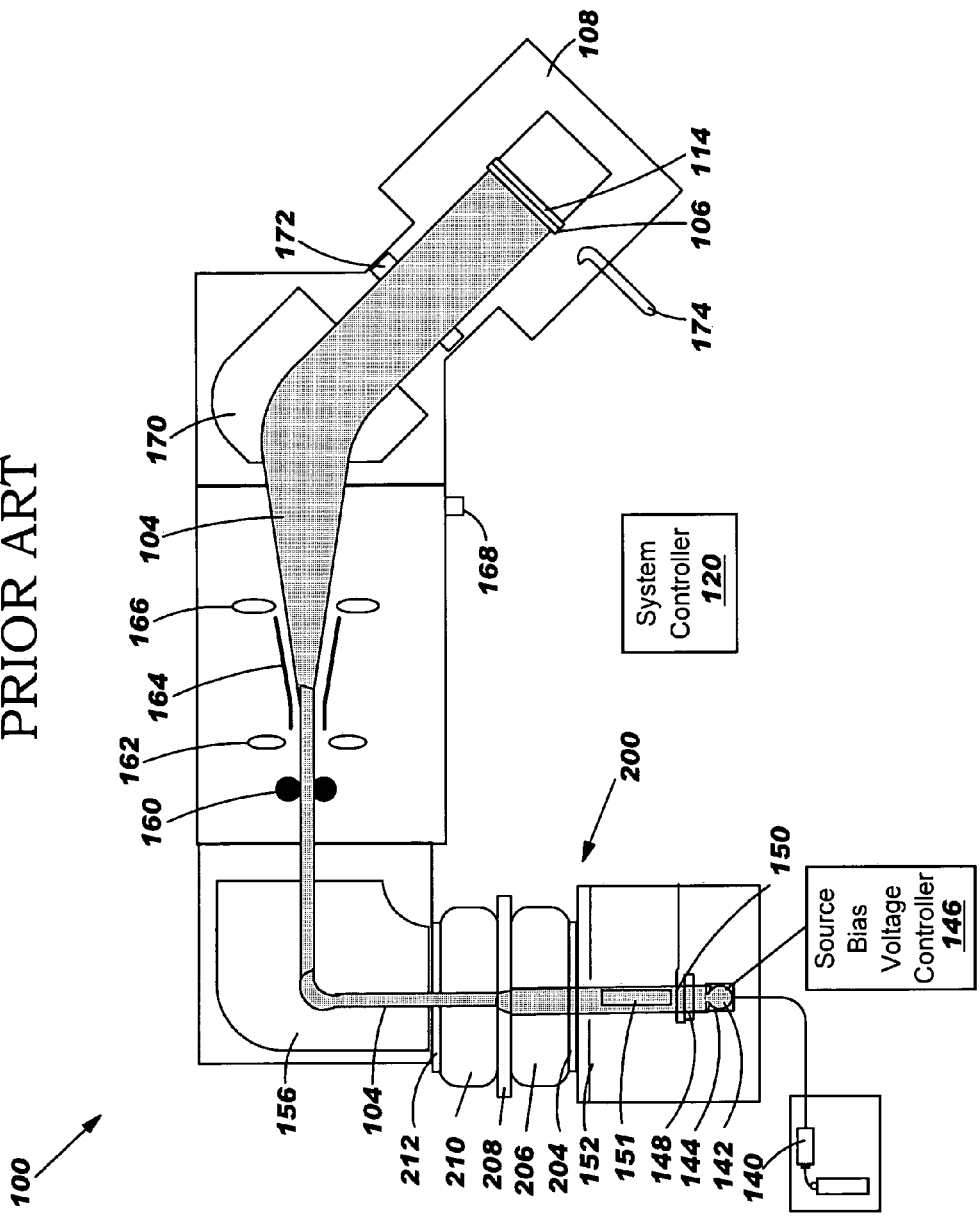
FIG. 1 shows a plan view of a conventional ion implanter.
Figure 4:
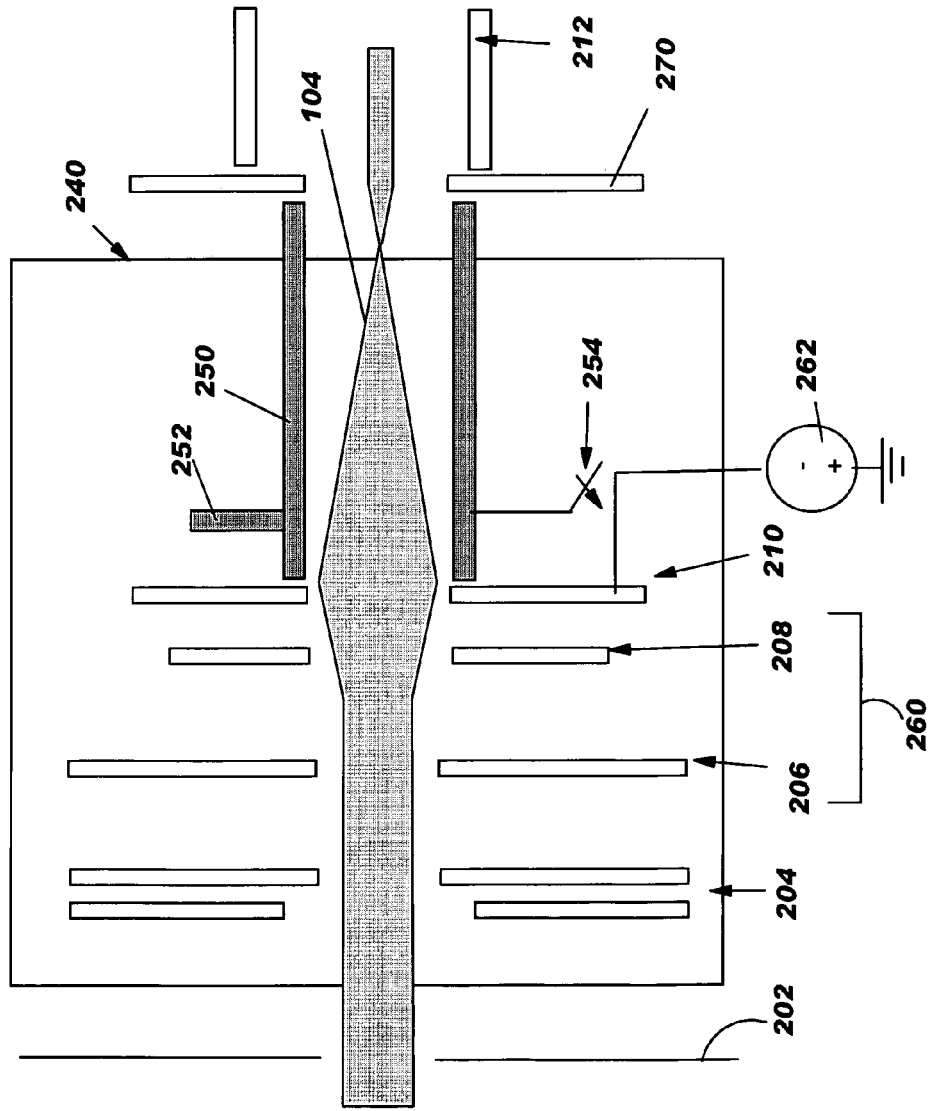
FIG. 4 shows a cross-sectional view of the acceleration-deceleration column including a tube lens according to an alternative embodiment of the invention in a deceleration mode.

Referring to FIG. 4, an alternative embodiment of the invention is shown. This embodiment is substantially similar to that of FIG. 3, except for the addition of a deceleration-suppression electrode 270 positioned immediately downstream of tube lens 250. In this embodiment, in the deceleration mode, a more negative voltage is applied to acceleration-suppression electrode 210 and deceleration-suppression electrode 270 than is applied to tube lens 250. The electric fields generated between acceleration-suppression electrode 210 and the entrance of tube lens 250, and between deceleration-suppression electrode 270 and the exit of tube lens 250 produce electron traps to confine electrons inside the tube lens, which improves space charge neutralization of ion beam 104 inside tube lens 250. Combined with the defocusing effect of tube lens 250, this electron confinement minimizes beam transport losses in analyzer magnet 156 (FIG. 1).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An apparatus for weakening a focusing effect of an acceleration-deceleration column for an ion beam in an ion implanter, the apparatus comprising:
   a tube lens surrounding the ion beam and adjacent to a deceleration lens of the acceleration-deceleration column.

2. The apparatus of claim 1, wherein a length of the tube lens is chosen to allow defocusing of the ion beam within its length.

3. The apparatus of claim 1, wherein the acceleration-deceleration column has an acceleration mode in which the ion beam is accelerated and a deceleration mode in which the ion beam is decelerated.

4. The apparatus of claim 3, wherein the tube lens is grounded in the acceleration mode such that the tube lens has no affect on the ion beam.

5. The apparatus of claim 3, wherein the tube lens is charged with a negative voltage in the deceleration mode such that the tube lens acts as a defocusing lens to gradually weaken the focusing effect of the acceleration-deceleration column.

6. The apparatus of claim 5, wherein the tube lens is electrically coupled to an acceleration-suppression electrode of the acceleration-deceleration column in the deceleration mode.

7. The apparatus of claim 1, further comprising an acceleration-suppression electrode positioned immediately upstream of the tube lens and a deceleration-suppression electrode positioned immediately downstream of the tube lens,
   wherein, in the deceleration mode, a more negative voltage is applied to the acceleration-suppression electrode and the deceleration-suppression electrode than is applied to the tube lens to confine electrons inside the tube lens.

8. The apparatus of claim 1, wherein the tube lens includes a radially extending mount.

9. The apparatus of claim 1, wherein the deceleration lens includes terminal electrodes, a focus electrode and a ground electrode.

10. An acceleration-deceleration column for an ion beam in an ion implanter, the acceleration-deceleration column comprising:
    a deceleration lens for decelerating the ion beam including terminal electrodes, a focus electrode adjacent the terminal electrodes and a ground electrode adjacent the focus electrode; and
    a tube lens surrounding the ion beam adjacent to the deceleration lens.

11. The column of claim 10, wherein a length of the tube lens is chosen to allow defocusing of the ion beam within its length.

12. The column of claim 10, wherein the acceleration-deceleration column has an acceleration mode in which the ion beam is accelerated and a deceleration mode in which the ion beam is decelerated.

13. The column of claim 12, wherein the tube lens is grounded in the acceleration mode such that the tube lens has no affect on the ion beam.

14. The column of claim 12, wherein the tube lens is charged with a negative voltage in the deceleration mode such that the tube lens acts as a defocusing lens to gradually weaken the focusing effect of the acceleration-deceleration column.

15. The column of claim 14, wherein the tube lens is electrically coupled to an acceleration-suppression electrode of the acceleration-deceleration column in the deceleration mode.

16. The column of claim 10, further comprising an acceleration-suppression electrode positioned immediately upstream of the tube lens and a deceleration-suppression electrode positioned immediately downstream of the tube lens,
    wherein, in the deceleration mode, a more negative voltage is applied to the acceleration-suppression electrode and the deceleration-suppression electrode than is applied to the tube lens to confine electrons inside the tube lens.

17. The column of claim 10, further comprising a coupling device for sealingly coupling to a downstream analyzer magnet.

18. The column of claim 10, wherein the tube lens includes a radially extending mount.

19. An ion implanter comprising:
    an ion source for generating an ion beam;
    an acceleration-deceleration column for accelerating or decelerating the ion beam, the acceleration-deceleration column including a deceleration lens;
    a tube lens surrounding the ion beam and adjacent to the deceleration lens;
    an analyzer magnet downstream from the tube lens; and
    an implant chamber for holding a target to be implanted by the ion beam.

20. The ion implanter of claim 19, wherein a length of the tube lens is chosen to allow defocusing of the ion beam within its length.

21. The ion implanter of claim 19, wherein the acceleration-deceleration column has an acceleration mode in which the ion beam is accelerated and a deceleration mode in which the ion beam is decelerated.

22. The ion implanter of claim 21, wherein the tube lens is grounded in the acceleration mode such that the tube lens has no affect on the ion beam.

23. The ion implanter of claim 21, wherein the tube lens is charged with a negative voltage in the deceleration mode such that the tube lens acts as a defocusing lens to gradually weaken the focusing effect of the deceleration lens.

24. The ion implanter of claim 23, wherein the tube lens is electrically coupled to an acceleration-suppression electrode of the acceleration-deceleration column in the deceleration mode.

25. The ion implanter of claim 19, further comprising an acceleration-suppression electrode positioned immediately upstream of the tube lens and a deceleration-suppression electrode positioned immediately downstream of the tube lens,
    wherein, in the deceleration mode, a more negative voltage is applied to the acceleration-suppression electrode and the deceleration-suppression electrode than is applied to the tube lens to confine electrons inside the tube lens.

26. The ion implanter of claim 19, wherein the tube lens includes a radially extending mount.

27. The ion implanter of claim 19, wherein the tube lens is electrically coupled to an acceleration-suppression elec trode of the acceleration-deceleration column in the deceleration mode.

28. A method of weakening a focusing effect of an acceleration-deceleration column for an ion beam in an ion implanter, the method comprising the steps of:
   decelerating the ion beam using the acceleration-deceleration column; and
   transmitting the ion beam through a tube lens having a negative potential during the decelerating step to defocus the ion beam.

29. The method of claim 28, further comprising the step of electrically coupling the tube lens to an acceleration-suppression electrode of the acceleration-deceleration column during the deceleration step.

30. The method of claim 28, wherein a length of the tube lens is chosen to allow defocusing of the ion beam within its length.

31. The method of claim 28, further comprising the steps of:
   accelerating the ion beam using the acceleration-deceleration column; and
   transmitting the ion beam through the tube lens, which is grounded, during the accelerating step so as to have no effect on the ion beam.

32. The method of claim 28, further comprising the steps of applying a more negative voltage to an acceleration-suppression electrode positioned immediately upstream of the tube lens and a deceleration-suppression electrode positioned immediately downstream of the tube lens than applied to the tube lens to confine electrons inside the tube lens.

* * * * *